(12) United States Patent
Lee et al.

(10) Patent No.: US 10,134,773 B2
(45) Date of Patent: Nov. 20, 2018

(54) DISPLAY DEVICE AND MANUFACTURING METHOD THEREOF

(71) Applicant: Samsung Display Co., Ltd., Yongin-si (KR)

(72) Inventors: Pil Suk Lee, Seoul (KR); Ju Chan Park, Seoul (KR); Young Gug Seol, Hwaseong-si (KR); Sun Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 5 days.

(21) Appl. No.: 15/643,398

(22) Filed: Jul. 6, 2017

(65) Prior Publication Data
US 2018/0040633 A1 Feb. 8, 2018

(30) Foreign Application Priority Data
Aug. 5, 2016 (KR) .................. 10-2016-0100310

(51) Int. Cl.
*H01L 27/00* (2006.01)
*H01L 27/12* (2006.01)
(Continued)

(52) U.S. Cl.
CPC ........ *H01L 27/124* (2013.01); *H01L 27/1218* (2013.01); *H01L 27/1262* (2013.01);
(Continued)

(58) Field of Classification Search
CPC ............... H01L 27/124; H01L 27/1218; H01L 27/1262; H01L 27/3276; H01L 51/52; H01L 51/0545; H01L 51/102; H01L 51/0053; H01L 2227/323; H01L 2251/5338; G02F 1/133305;
(Continued)

(56) References Cited

U.S. PATENT DOCUMENTS 9,740,035 B2 * 8/2017 Kwon ............... G02F 1/133305
2014/0097408 A1 4/2014 Kim et al.
(Continued)

FOREIGN PATENT DOCUMENTS

KR 10-2014-0045193 4/2014
KR 10-2015-0006706 1/2015
KR 10-2015-0074808 7/2015

*Primary Examiner* — Nikolay Yushin
(74) *Attorney, Agent, or Firm* — H.C. Park & Associates, PLC

(57) ABSTRACT

A display device including a substrate including a display area for displaying an image and a non-display area provided on a side of the display area and including a bending area bent with respect to an axis parallel to a first direction; a plurality of step portions disposed in the bending area and extending in the first direction; a plurality of bridge electrodes extending in a second direction crossing the first direction in the bending area; and a plurality of pattern portions disposed in the bending area. The step portions are spaced apart from each other, and the pattern portions are disposed between adjacent step portions. The pattern portions are lower than the step portions, and an acute angle of sides of each of the pattern portions from the substrate is smaller than an acute angle of sides of each of the step portions from the substrate.

16 Claims, 13 Drawing Sheets

(51) Int. Cl.
*H01L 27/32* (2006.01)
*G02F 1/1333* (2006.01)
*G02F 1/1343* (2006.01)
*G02F 1/1345* (2006.01)
*G02F 1/1362* (2006.01)
*G02F 1/1368* (2006.01)
*G09G 3/3225* (2016.01)
*G09G 3/3266* (2016.01)
*G09G 3/3275* (2016.01)
*G09G 3/36* (2006.01)
*H01L 21/3213* (2006.01)
*H01L 51/52* (2006.01)

(52) U.S. Cl.
CPC ........ *H01L 27/3276* (2013.01); *G02F 1/1368* (2013.01); *G02F 1/13439* (2013.01); *G02F 1/13452* (2013.01); *G02F 1/13458* (2013.01); *G02F 1/133305* (2013.01); *G02F 1/133345* (2013.01); *G02F 1/134309* (2013.01); *G02F 1/136286* (2013.01); *G02F 2001/136295* (2013.01); *G02F 2201/121* (2013.01); *G02F 2201/123* (2013.01); *G09G 3/3225* (2013.01); *G09G 3/3266* (2013.01); *G09G 3/3275* (2013.01); *G09G 3/3677* (2013.01); *G09G 3/3688* (2013.01); *G09G 2300/0426* (2013.01); *G09G 2380/02* (2013.01); *H01L 21/32133* (2013.01); *H01L 51/52* (2013.01); *H01L 2227/323* (2013.01); *H01L 2251/5338* (2013.01)

(58) Field of Classification Search
CPC ......... G02F 1/133345; G02F 1/134309; G02F 1/13439; G02F 1/13452; G02F 1/13458; G02F 1/136286; G02F 1/1368; G02F 2001/136295; G02F 2001/133746; G02F 2001/133761; G02F 2201/121; G02F 2201/123; G09G 3/3225; G09G 3/3266; G09G 3/3275; G09G 3/3677; G09G 3/3688; G09G 2300/0426; G09G 2380/02
See application file for complete search history.

(56) References Cited

U.S. PATENT DOCUMENTS

| | | |
|---|---|---|
| 2014/0232956 A1* | 8/2014 | Kwon ............... G02F 1/133305 349/12 |
| 2015/0179728 A1 | 6/2015 | Kwon et al. |
| 2016/0141545 A1 | 5/2016 | Kim |

* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2016-0100310, filed on Aug. 5, 2016, which is hereby incorporated by reference for all purposes as if fully set forth herein.

BACKGROUND

Field

Exemplary embodiments relate to a display device and a manufacturing method thereof. More particularly, exemplary embodiments relate to a display device for bending a non-display area and a manufacturing method thereof.

Discussion of the Background

Display devices, such as an organic light emitting device and a liquid crystal display, are manufactured by generating a plurality of layers and elements on a substrate. A glass substrate, which is typically used as a substrate of the display device, is heavy and easily broken. Further, the glass substrate is rigid so it is difficult to deform the display device. To alleviate these drawbacks, a flexible substrate that is light in weight, resistant to impacts, and easily transformed is used.

The display device using a flexible substrate may be manufactured to bend at an edge where a pad portion to which a flexible printed circuit film (FPC) for transmitting signals is located, thereby reducing a dead space, as compared to the display device using a rigid substrate. When the dead space is reduced, a bezel width of the display device may be reduced and usage of an inner space of the display device may be increased so the display device may be manufactured to be more compact.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide improved reliability of signal lines in a bending area in a display device bending in a non-display area.

Additional aspects will be set forth in the detailed description which follows, and, in part, will be apparent from the disclosure, or may be learned by practice of the inventive concept.

An exemplary embodiment discloses a display device including: a substrate including a display area for displaying an image and a non-display area provided on a side of the display area and including a bending area bent with respect to an axis parallel to a first direction; a plurality of step portions disposed in the bending area and extending in the first direction; a plurality of bridge electrodes extending in a second direction crossing the first direction in the bending area; and a plurality of pattern portions disposed in the bending area. The step portions are spaced apart from each other, and the pattern portions are disposed between adjacent step portions. The pattern portions are lower than the step portions, and an acute angle of each of the sides of the pattern portions from the substrate is smaller than an acute angle of each of the sides of the step portions from the substrate.

The pattern portions may include an organic material, and the step portions may include an inorganic material.

The pattern portions may extend in the same direction as the step portions.

The step portions may have a line shape in a plan view and may be spaced apart from each other at regular intervals.

The pattern portions may have a line shape or an oval shape in a plan view, and may be spaced apart from each other at regular intervals.

The display device may further include a plurality of signal lines extending to the non-display area from the display area and a driver disposed in the non-display area, wherein the bridge electrodes connect the signal lines with the driver.

The bridge electrodes may be disposed on the step portions.

The bridge electrodes may include at least one of aluminum and titanium.

An exemplary embodiment also discloses a method for manufacturing a display device, including: providing a substrate including a display area for displaying an image and a non-display area provided on a side of the display area and including a bending area to be bent with respect to an axis parallel to a first direction; forming a plurality of signal lines and a plurality of pads on the substrate; forming at least one insulating layer on the signal lines and the pads; forming a plurality of step portions in the bending area by etching the at least one insulating layer; forming a pattern forming layer on the step portions and etching the pattern forming layer to form a plurality of patterns; forming a bridge electrode forming layer on the step portions and the pattern portions; and forming a plurality of bridge electrodes by etching the bridge electrode forming layer. The step portions are spaced apart from each other and extend in the first direction, and the pattern portions are formed between adjacent step portions. The pattern portions are lower than the step portions, and an acute angle of sides of each of the pattern portions from the substrate is smaller than an acute angle of each of the sides of the step portions from the substrate.

The pattern forming layer may be formed with a material including an organic material, and the at least one insulating may be formed with a material including an inorganic material.

The pattern portions may extend in the same direction as the step portions.

The step portions may have a line shape in a plan view and may be spaced apart from each other at regular intervals.

The pattern portions may have a line shape or an oval shape in a plan view and may be spaced apart from each other at regular intervals.

The bridge electrodes may connect the signal lines with the pads.

The bridge electrode forming layer may be formed with a material including at least one of aluminum and titanium.

The signal lines may cross the bridge electrodes.

According to the exemplary embodiments, the stress caused by the bending of the non-display area in the display device may be reduced, and the signal lines in the bending area are prevented from being fractured or short-circuited, thereby improving reliability of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
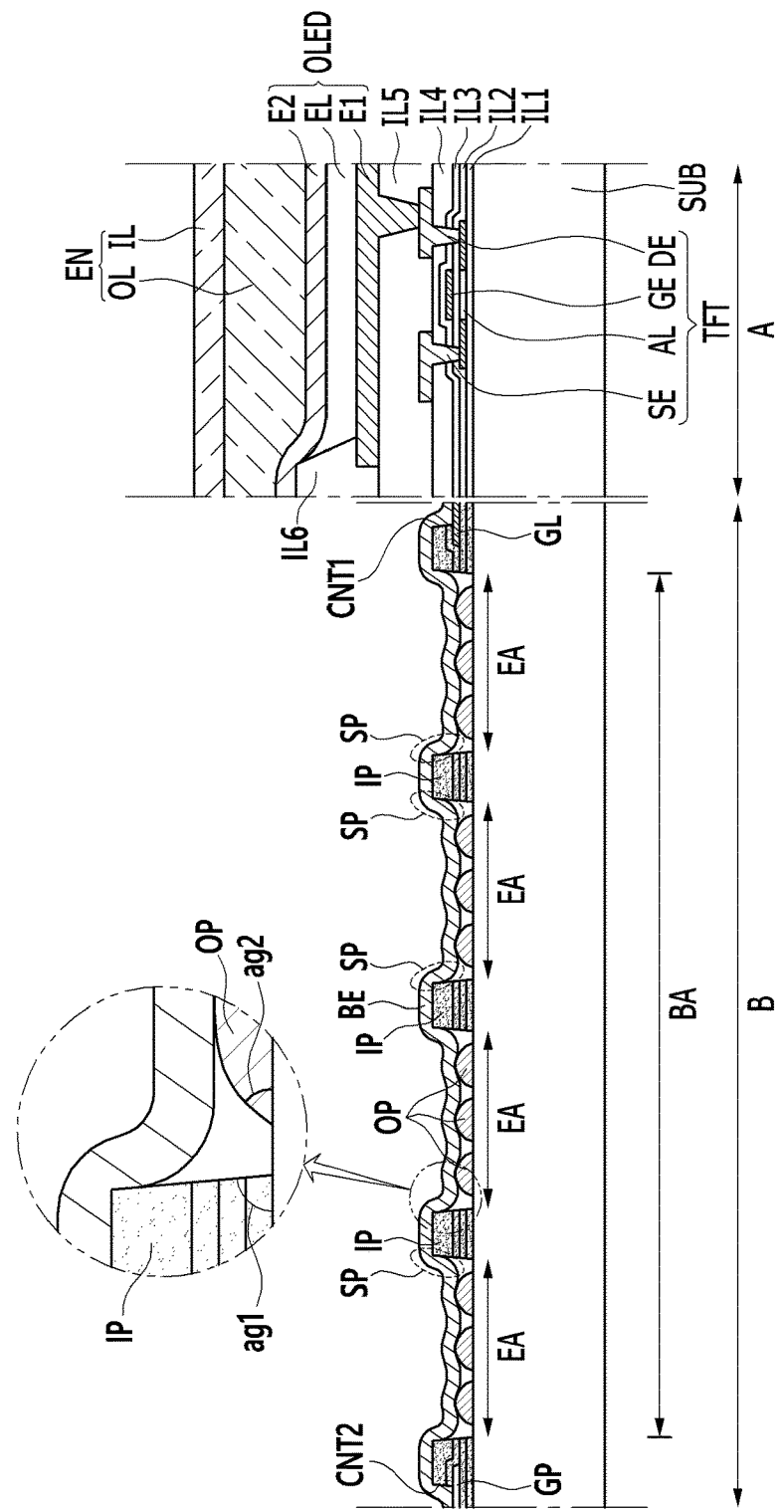
FIG. 1 shows a cross-sectional view of part of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A display device according to an exemplary embodiment will now be described with reference to FIG. 1. FIG. 1 shows a cross-sectional view of part of a display device according to an exemplary embodiment of the present invention.

The display device according to an exemplary embodiment includes a display area including a plurality of pixels and displaying an image, and a non-display area in which various kinds of wires are provided and does not display an image. A first area (A) of FIG. 1 represents a cross-section of a portion where a transistor (TFT) is provided on one pixel in the display area of the display device. A second area (B) of FIG. 1 indicates a cross-section that is incised in a direction parallel to the direction in which a bridge electrode (BE) of the bending area (BA) extends in the non-display area of the display device.

Referring to the first area (A) of FIG. 1, the display device includes a substrate (SUB), and a thin film transistor (TFT) is provided on the substrate (SUB). The thin film transistor (TFT) includes an active layer (AL), a gate electrode (GE), a source electrode (SE), and a drain electrode (DE). The gate electrode (GE) is connected to a gate line (not shown), and the source electrode (SE) is connected to a data line (not shown).

The active layer (AL) may be made of polysilicon or an oxide semiconductor. The active layer (AL) includes a channel area that is not doped with impurities, and a source area and a drain area that are formed on opposite sides of the channel area by being doped with impurities. A first insulating layer IL1 may be provided between the substrate (SUB) and the thin film transistor (TFT).

The gate electrode (GE) is provided on the active layer (AL) with a second insulating layer IL2 therebetween. The source electrode (SE) and the drain electrode (DE) are provided on a third insulating layer IL3 and a fourth insulating layer IL4 for covering the gate electrode (GE), respectively, and are connected to the source region and the drain region of the active layer (AL) through contact holes formed in the second insulating layer IL2, the third insulating layer IL3, and the fourth insulating layer IL4. The drain electrode (DE) is connected to a first electrode E1 of an organic light emitting diode (OLED) through a contact hole formed in a fifth insulating layer IL5. The active layer is provided between the substrate and the gate electrode in the present exemplary embodiment, and the gate electrode may be provided between the substrate and the active layer according to an exemplary embodiment.

The organic light emitting diode (OLED) includes a first electrode E1 connected to the drain electrode DE of the thin film transistor (TFT), an organic emission layer (EL) provided on the first electrode E1, and a second electrode E2 provided on the organic emission layer (EL). A sixth insulating layer IL6 is provided on the first electrode E1 to define a section in which the organic emission layer (EL) is formed.

The first electrode E1 may be an anode that is a hole injection electrode, and the second electrode E2 provided on the organic emission layer (EL) may be a cathode that is an electron injection electrode. Conversely, the first electrode E1 may be a cathode that is an electron injection electrode, and the second electrode E2 that is provided on the organic emission layer (EL) may be an anode that is a hole injection electrode.

The organic emission layer (EL) is provided between the first electrode E1 and the second electrode E2, and it may include a low molecular organic material or a polymeric organic material, such as poly(3,4-ethylenedioxythiophene) (PEDOT). The organic emission layer may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby realizing various color images.

An encapsulation portion (EN) covers the substrate (SUB) with the organic light emitting diode (OLED) therebetween to seal the display area. The encapsulation portion (EN) may include an organic layer (OL) and an inorganic layer (IL) provided on the organic layer (OL).

Referring to the second area (B) of FIG. 1, a plurality of step portions (IP) are provided on the bending area (BA) of the non-display area, and the step portions (IP) include an inorganic material. The step portions (IP) may be provided at regular intervals (EA) in the bending area, and the step portions (IP) may extend in parallel to a bending axis direction in which the substrate (SUB) is bent in a line form. A height of each of the step portions (IP) may substantially correspond to the height of the stacked first insulating layer ILL second insulating layer IL2, third insulating layer IL3, and fourth insulating layer IL4. A width each of the step portions (IP) may be about equal to or greater than 9 micrometers (μm) and equal to or less than 13 μm, and in detail, it may be about 11 μm. An interval (EA) between the step portions (IP) may be about equal to or greater than 9 μm and equal to or less than 13 μm, and in detail, it may be about 11 μm. The step portions (IP) may all have the same height and width. Alternatively, the step portions (IP) may have different heights and widths. The intervals (EA) between the step portions (IP) may be different from each other. Various numbers of step portions (IP) may be formed. The step portions (IP) may be made of an inorganic material. A first angle ag1 that is an acute angle of sides of each of the step portions (IP) from the substrate (SUB) may be equal to or greater than about 80 degrees (°) and equal to or less than about 90°, and in detail, it may be about 85°.

A plurality of pattern portions (OP) are provided among the step portions (IP). The pattern portions (OP) include an organic material. A second angle ag2 that is an acute angle of sides of each of the pattern portions OP from the substrate (SUB) is less than the first angle ag1 that is an acute angle of the sides of the step portions (IP) from the substrate (SUB). The second angle ag2 may be equal to or greater than about 30° and equal to or less than about 45°, and in detail, it may be about 36° or about 40°. The pattern portions (OP) may be provided at regular intervals, and the pattern portions (OP) may extend as a line in parallel with the direction in which the step portions (IP) extend. A surface of each of the pattern portions (OP) may be curved. The pattern portions (OP) may be lower than the step portions (IP). A height of the pattern portions (OP) may be equal to or greater than about 700 nanometers (nm) and equal to or less than about 800 nm.

The intervals between the pattern portions OP may be about 2 micrometers (μm). The pattern portions OP may have the same height and width. Alternatively, the pattern portions (OP) may have different heights and widths. The intervals between the pattern portions (OP) may be different from each other. Various numbers of the pattern portions (OP) may be formed. The pattern portions (OP) may be made of an inorganic material. The pattern portions (OP) may include a polyimide and may include a photosensitive material.

A plurality of bridge electrodes (BE) separated from each other are provided on the step portions (IP) and the pattern portions (OP). The bridge electrodes (BE) may include aluminum (Al) and/or titanium (Ti). The bridge electrode (BE) may be connected to the gate line (GL) extending from the display area through a first connection hole CNT1, and the bridge electrode (BE) may be connected to the gate pad (GP) through a second connection hole CNT2. That is, the bridge electrode (BE) connects the gate line (GL) and the gate pad (GP). The gate pad (GP) may be an end portion of the gate driver integrated on the substrate (SUB). A gate signal generated by the gate driver may be transmitted to the gate line (GL) through the bridge electrode (BE) that electrically connects the gate pad (GP) with the gate line (GL). The gate pad (GP) may receive a signal from an external device may be disposed on an edge of the substrate (SUB) in the non-display area (NA). The gate pad (GP) transmits the signal to the gate line (GL) through the bridge electrode (BE). The bridge electrodes (BE) may be provided on a same layer as the source electrode (SE) and the drain electrode (DE), and may be formed of a same material as the source electrode (SE) and the drain electrode (DE). The bridge electrodes (BE) may extend to cross a the step portions (IP), and may be separated from each other at regular intervals in a direction in which the step portions (IP) extend. A height difference of the bridge electrodes (BE) formed on the step portions (IP) from the substrate (SUB) may be reduced by a plurality of pattern portions (OP) formed among the step portions (IP) so the bridge electrodes (BE) may be formed to have a gentle slope on a side portion (SP) of the step portion (IP). The bridge electrode (BE) may be completely removed from the portion where the bridge electrodes (BE) are separated from each other.

A display device according to an exemplary embodiment of the present invention will now be described focusing on the bending area (BA) with reference to FIG. 2 to FIG. 5. Description of the same parts as in the above-described exemplary embodiment will be omitted.

Figure 2:
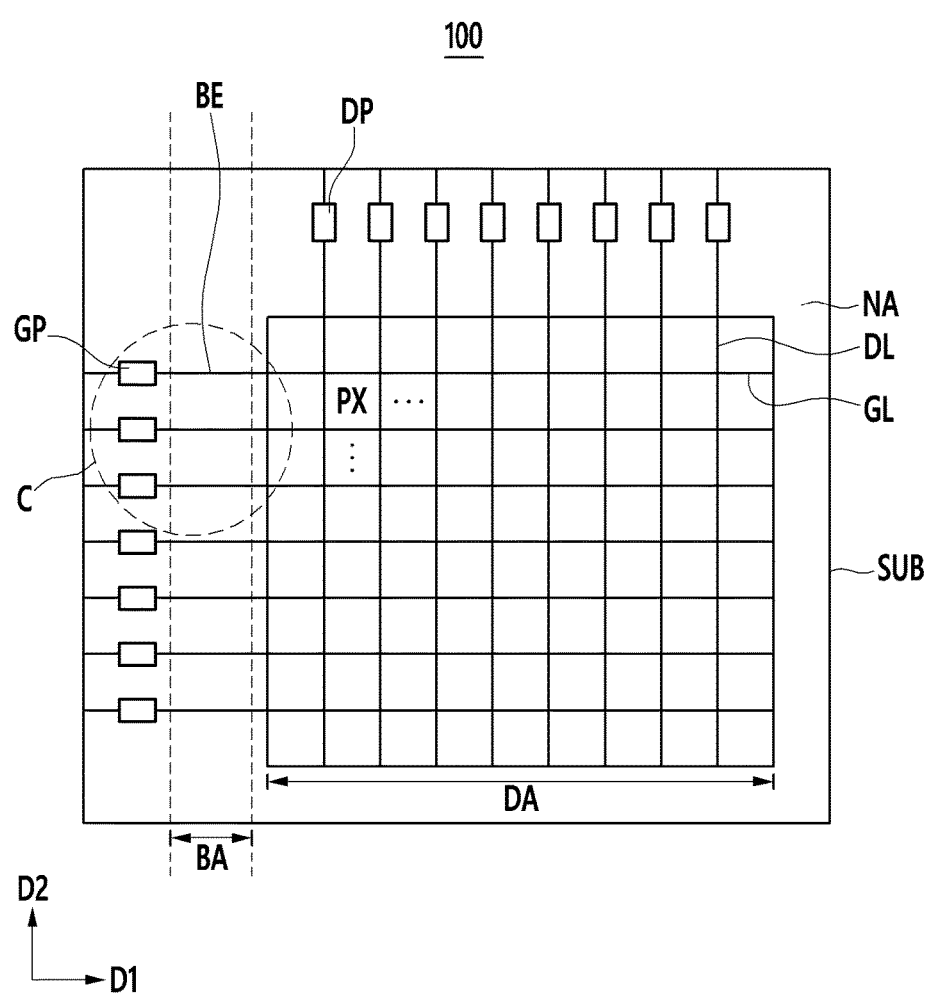
FIG. 2 shows a top plan view of a display device according to an exemplary embodiment of the present invention.
Figure 3:
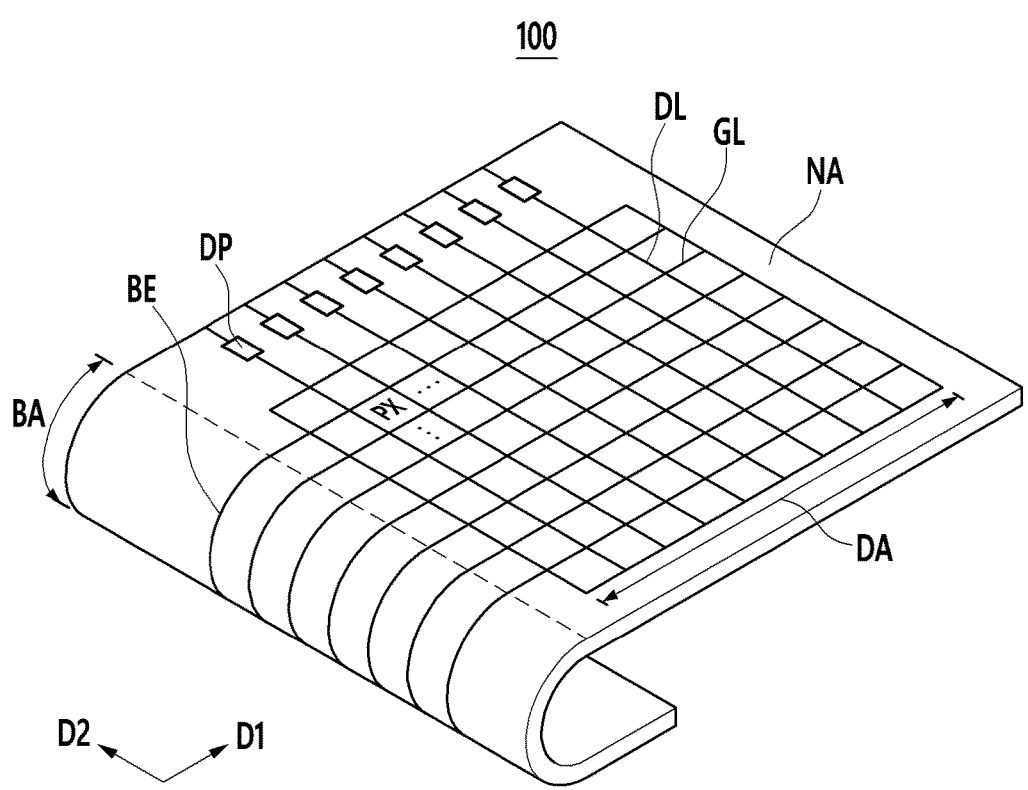
FIG. 3 shows a top plan view of a display device according to an exemplary embodiment of the present invention.
Figure 4:
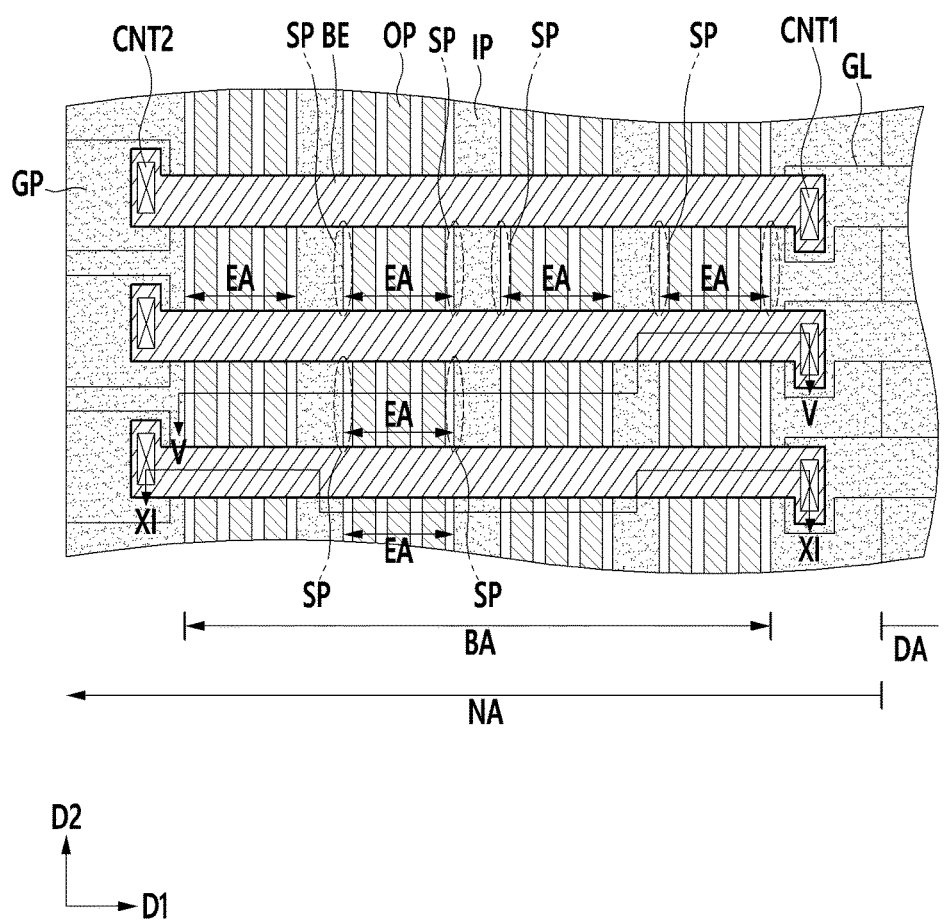
FIG. 4 shows an enlarged surface of area C of a substrate shown in FIG. 2.
Figure 5:
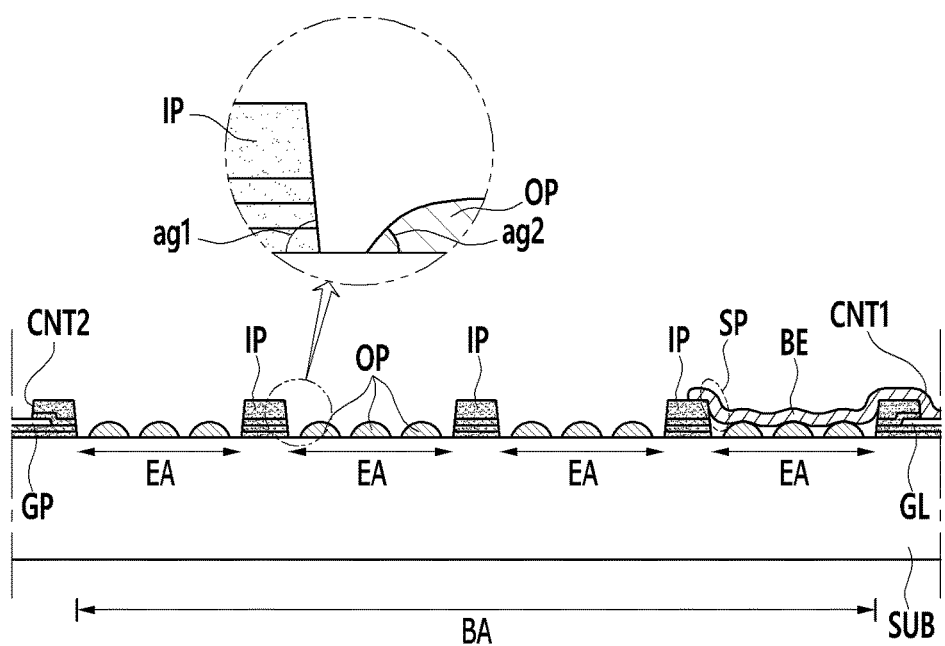
FIG. 5 shows a cross-sectional view of a display device taken along line V-V in FIG. 4.

FIG. 2 shows a top plan view of a display device according to an exemplary embodiment of the present invention. FIG. 3 shows a top plan view of a display device according to an exemplary embodiment of the present invention. FIG. 4 shows an enlarged surface of a substrate that is an area C of FIG. 2. FIG. 5 shows a cross-sectional view of a display device of FIG. 4 with respect to a line V-V.

Referring to FIG. 1 and FIG. 2, the display device 100 includes a flexible substrate (SUB) made of plastic, and a gate line (GL), a gate pad (GP), a data line (DL), and a data pad (DP) provided on the substrate (SUB). The substrate (SUB) includes a display area (DA) and a non-display area (NA) surrounding the display area (DA). The display area (DA) is a region displaying an image by outputting the image, and the non-display area (NA) is a region where elements and/or wires are formed to generate and/or transmit various signals applied to the display area (DA).

A gate pad (GP) and a data pad (DP) for receiving a signal from the outside of the display area (DA) are provided in the non-display area (NA). The gate pad (GP) and the data pad (DP) are disposed at a predetermined interval along the edge of the substrate (SUB). A gate line (GL) is connected to the gate pad (GP), and a data line (DL) is connected to the data pad (DP).

A first end of a flexible printed circuit film (FPC) (not shown) is connected to the pads (GP and DP). The flexible printed circuit film (not shown) includes a second end that may be connected to a printed circuit board (PCB) (not shown) to transmit signals, such as control signals or image data signals.

A driving device for generating and/or processing various signals for driving the display area (DA) may be provided in the non-display area (NA) or on the flexible printed circuit film (not shown), and it may be provided on the printed circuit board (PCB) (not shown). The driving device may include a data driver for applying a data signal to the data line, a gate driver for applying a gate signal to the gate line, and a signal controller for controlling the data driver and the gate driver. The gate driver may be integrated on the substrate in the non-display area (NA).

A plurality of pixels PX may be disposed in a matrix direction in the display area (DA) of the substrate (SUB), and at least one thin film transistor (TFT) (not shown) is disposed on each pixel PX.

In the display area (DA), the gate lines (GL) may extend in a first direction D1, and the data lines (DL) may extend in a second direction D2 vertically crossing the gate lines (GL). In the display area (DA), the gate lines (GL) and the data lines (DL) connected to the pixels may extend to the non-display area (NA) and may be connected to the gate pad (GP) and the data pad (DP), respectively. Here, the gate line (GL) may be connected to the gate pad (GP) through the bridge electrode (BE) in the non-display area (NA). Further, although not shown, the data line (DL) may be connected to the data pad (DP) through the bridge electrode (BE) in the non-display area (NA).

Referring to FIG. 2 and FIG. 3, the non-display area (NA) of the display device 100 includes a bending area (BA) that may be bent. The bending area (BA) may bend the non-display area (NA) behind the display area (DA) to reduce a dead space provided around the display area (DA). The bending area (BA) may be provided near the edge of the display area (DA) on a left side of the display area (DA) from among the non-display area (NA). The bending area (BA) may bend the substrate (SUB) along an axis with respect to the second direction D2.

FIG. 2 shows a state prior to bending of the bending area (BA) of the substrate (SUB, and FIG. 3 shows a state subsequent to bending of the bending area (BA) of the substrate (SUB). When the bending area (BA) of the substrate (SUB) is bent, the bridge electrode (BE) provided on the bending area (BA) of the non-display area (NA) and at least some of the signal lines, such as a gate line (GL), may have a curvature, and at least some thereof may be bent together with the substrate (SUB). When the bending area (BA) of the substrate (SUB) is bent, the flexible printed circuit film (not shown) may be provided behind the display area (DA).

Referring to FIG. 4 and FIG. 5, a plurality of step portions (IP) and a plurality of pattern portions (OP) are provided in the bending area (BA) of the non-display area (NA). The step portions (IP) may extend in a line form in the second direction D2 that is parallel to the bending axis on which the substrate (SUB) is bent. The step portions (IP) may be separated from each other at regular intervals (EA) to reduce a stress caused by the bending when the bending area (BA) is bent. The step portions (IP) may be generated by forming insulating layers in the non-display area (NA) when forming the insulating layers between elements of transistors such as a gate electrode, a semiconductor layer, a source electrode, and a drain electrode in the display area (DA), and then removing the insulating layers formed in the bending area (BA) at regular intervals. A height of the step portions (IP) may substantially correspond to a height of the insulating layer stacked below the source electrode and the drain electrode of the display area (DA). The step portions (IP) may be made of a same material as the insulating layer of the display area (DA) and include an inorganic material. The step portions (IP) may have a steep inclination on the sides thereof because of a characteristic of the inorganic material. The first angle ag1 that is an acute angle of the sides of a plurality of step portions (IP) from the substrate (SUB) may be equal to or greater than about 80° and equal to or less than about 90°, and in detail, it may be about 85°.

A plurality of pattern portions (OP) are provided among the step portions (IP). The pattern portions (OP) may extend as a line in the second direction D2 that is parallel to the direction in which the step portions (IP) extend. A surface of the pattern portion (OP) may have a curvature. The pattern portions (OP) may be provided at regular intervals. The pattern portions (OP) may be lower than the step portions (IP), and include an organic material. The pattern portions (OP) may have a gentle inclination on the sides thereof because of a characteristic of the organic material. A second angle ag2 that is an acute angle of sides of each of the pattern portions OP from the substrate (SUB) is less than the first angle ag1 that is an acute angle of each of the sides of the step portions (IP) from the substrate (SUB). The second angle ag2 may be equal to or greater than about 30° and equal to or less than about 45°, and in detail, it may be about 36° or about 40°.

A plurality of bridge electrodes (BE) extending in the first direction D1 traversing the step portions (IP) are provided on the step portions (IP) and the pattern portions (OP). The bridge electrodes (BE) may be separated from each other at regular intervals in the direction in which the step portions (IP) extend. The bridge electrode (BE) may be connected to the gate line (GL) extending from the display area through a first connection hole CNT1, and the bridge electrode (BE) may be connected to the gate pad (GP) through a second connection hole CNT2. That is, the bridge electrode (BE) connects the gate line (GL) and the gate pad (GP). The bridge electrodes (BE) may be provided on a same layer as a source electrode (not shown) and a drain electrode (not shown) provided in the display area (DA), and may be formed of a same material as the source electrode and the drain electrode. The bridge electrodes (BE) may include aluminum (Al) and/or titanium (Ti), and in this case, they may be stronger to endure the stress occurring at the bending than the case of forming the same with a material such as the gate line (GL) including molybdenum (Mo). A height difference of the bridge electrodes (BE) formed on the step portions (IP) from the substrate (SUB) may be reduced by the pattern portions OP formed among the step portions (IP), so the bridge electrodes (BE) may be formed to have a gentle slope on a side portion (SP) of the step portion (IP). The bridge electrode (BE) may be completely removed from the portion where the bridge electrodes (BE) are separated from each other.

A method for driving a display device 100 will now be described with reference to FIG. 2 and FIG. 4. A plurality of pixels PX may receive a gate signal through the gate line (GL) connected to the gate pad (GP), may receive a data signal through the data line (DL) connected to the data pad (DP), and may then be driven. The gate pad (GP) may transmit a signal to the gate line (GL) through the bridge electrode (BE). Regarding one pixel PX, a switching transistor (not shown) includes a control terminal connected to the gate line (GL), an input terminal connected to the data line (DL), and an output terminal connected to a driving transistor (not shown). The switching transistor transmits the data signal provided by the data line (DL) to the driving transistor in response to the gate signal provided by the gate line (GL). The driving transistor includes a control terminal connected to the switching transistor, an input terminal connected to a driving voltage line (not shown), and an output terminal connected to an organic light emitting element (not shown). The driving transistor outputs an output current of which its value is variable by a voltage between the control terminal and the output terminal. The organic light emitting element (not shown) is provided in the display area (DA) of the substrate (SUB), and for example, it is an organic light emitting diode (OLED) including an anode (not shown) connected to the output terminal of the driving transistor and a cathode (not shown) connected to the common voltage. The organic light emitting element displays an image by varying the intensity according to the output current of the driving transistor. The organic light emitting element may include an organic material which uniquely emits light of any one of primary colors such as three primary colors of red, green, and blue, and the organic light emitting diode display displays a desired image by a spatial sum of these colors.

An exemplary embodiment of the present invention has been described in detail, but the scope of the present invention is not limited thereto, and various modifications may be made thereto. For example, the non-display area (NA) is shown to surround the display area (DA) in FIG. 2, and the non-display area (NA) may be provided on part of the edge of the display area (DA). For example, when the display area (DA) is a quadrangle, as shown in FIG. 2, the non-display area (NA) may be provided on at least one of four sides of the display area (DA). In addition, the bending area (BA) is illustrated to be provided on the left side of the display area (DA) of the non-display area (NA) in FIG. 2, and the bending area (BA) may be provided on at least one of the right, left, top, and bottom of the display area (DA) of the non-display area (NA). That is, the bending area (BA) may be provided on at least one of a plurality of sides of the substrate (SUB). Further, the bending axis may be provided in various directions according to the position of the bending area (BA). The bending axis may be parallel to the side of the adjacent display area (DA). At least part of at least one of signal lines provided in the non-display area (NA), such as the pads (GP and DP) and the signal lines (GL and DL), and the driver may be provided on the bending area (BA) depending on the position of the bending area (BA) and the bending curvature, or all of them may be provided in the bending area (BA).

Further, depending on exemplary embodiments, the step portions (IP) may have different heights and widths. Intervals (EA) between the step portions (IP) may be different from each other. Various numbers of step portions (IP) may be provided in addition to what is shown in the drawings.

According to exemplary embodiments, the pattern portions (OP) may have different heights and widths. Intervals (EA) between the pattern portions (OP) may be different from each other. Various numbers of pattern portions (OP) may be provided in addition to what is shown in the drawings.

Further, the organic light emitting device has been illustrated in the present exemplary embodiment, and according to another exemplary embodiment, the display device may be configured with a liquid crystal display in addition to the organic light emitting device, and in the case of the liquid crystal display, the display area may include a substrate, a liquid crystal layer including liquid crystal molecules, and an opposite substrate. The substrate may include a switching transistor including a control terminal connected to a gate line, an input terminal connected to a data line, and an output terminal connected to a pixel electrode, and the display area may control a tilt of liquid crystal molecules by an electric field formed between the pixel electrode receiving a data voltage and the common electrode receiving a common voltage to display various kinds of images. In addition, the display area may be configured so that a plurality of roof layers may be provided instead of omitting the opposite substrate, and a liquid crystal layer may be provided in a plurality of microcavities between a plurality of roof layers and a substrate.

A method for manufacturing a display device according to an exemplary embodiment of the present invention will now be described focusing on a bending area (BA) with reference to FIG. 4 and FIG. 6 to FIG. 11. Description of the same parts as in the above-described exemplary embodiment will not be provided. FIG. 6 to FIG. 11 show sequential cross-sectional views of a method for manufacturing a display device according to an exemplary embodiment of the present invention. Particularly, FIG. 6 to FIG. 11 show sequential stacking on cross-sectional portions that are cut with respect to the line XI-XI of FIG. 4 in the display device according to an exemplary embodiment of the present invention, and FIG. 11 which is the last drawing is a cross-sectional view with respect to the line XI-XI of FIG. 4.

Figure 6:
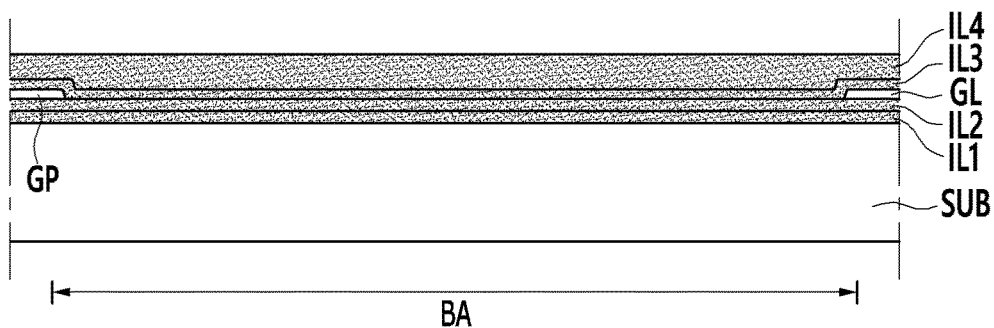
FIG. 6, FIG. 7, FIG. 8, FIG. 9, FIG. 10, and FIG. 11 show sequential cross-sectional views of a method for manufacturing a display device according to an exemplary embodiment of the present invention.

Referring to FIG. 6, a first insulating layer IL1, a second insulating layer IL2, a gate line (GL), a gate pad (GP), a third insulating layer IL3, and a fourth insulating layer IL4 are sequentially stacked on the substrate (SUB). The first insulating layer IL1, the second insulating layer IL2, the gate line (GL), the gate pad (GP), the third insulating layer IL3, and the fourth insulating layer IL4 may be stacked with a material including an inorganic material. The first insulating layer IL1 may be one that is stacked between a substrate (SUB) and an active layer when the active layer is formed in the display area, and the second insulating layer IL2 may be one that is stacked among an active layer, a gate electrode, and a gate line (GL) when the gate electrode and the gate line (GL) are formed on the active layer. In addition, the third insulating layer IL3 and the fourth insulating layer IL4 may be those that are stacked on the gate electrode and the gate line (GL), and particularly, the fourth insulating layer IL4 may be a planarization layer for planarizing a surface on the gate electrode and the gate line (GL).

Figure 7:
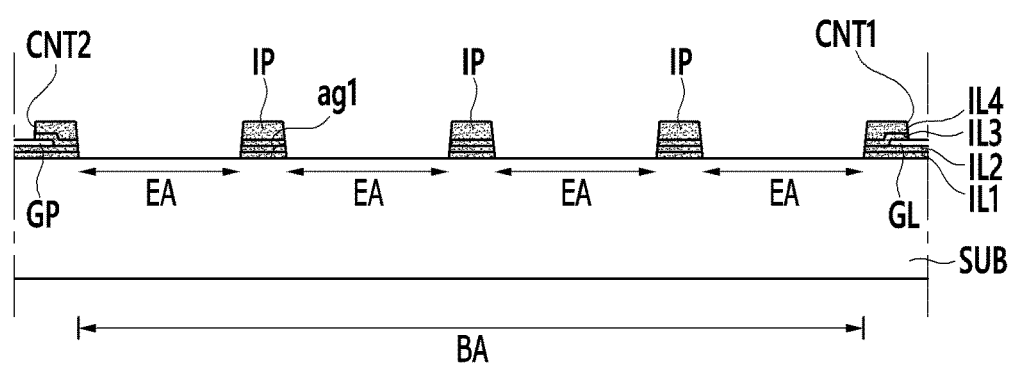

Referring to FIG. 7, the first insulating layer ILL the second insulating layer IL2, the third insulating layer IL3, and the fourth insulating layer IL4 are etched to form a first connection hole CNT1 for exposing the gate line (GL), a second connection hole CNT2 for exposing the gate pad (GP), and a plurality of step portions (IP) in a line form.

In this instance, part of the first insulating layer ILL the second insulating layer IL2, the third insulating layer IL3, and the fourth insulating layer IL4 are etched to form a constant interval (EA).

A plurality of step portions (IP) may be formed to extend in parallel with the direction of the bending axis for bending the substrate (SUB). A width of the step portion (IP) may be about equal to or greater than 9 μm and equal to or less than 13 μm, and in detail, it may be formed to be about 11 μm interval (EA) between the step portions (IP) may be equal to or greater than about 9 μm and equal to or less than 13 μm, and in detail, it may be formed to be about 11 μm. It may be etched such that a first angle ag1 that is an acute angle of sides of each of the step portions (IP) from the substrate (SUB) may be equal to or greater than about 80° and equal to or less than about 90°, and in detail, it may be about 85°. In this instance, the first angle ag1 of the step portions (IP) may be formed to be smaller by using an etchant with a low etching rate.

Figure 8:
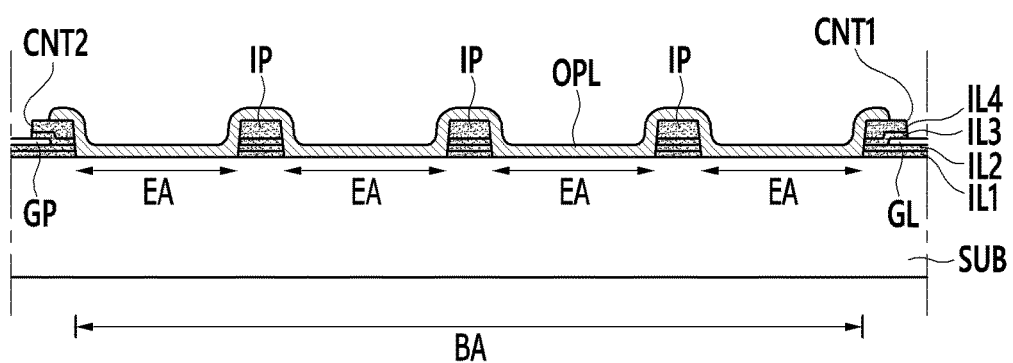
Figure 9:
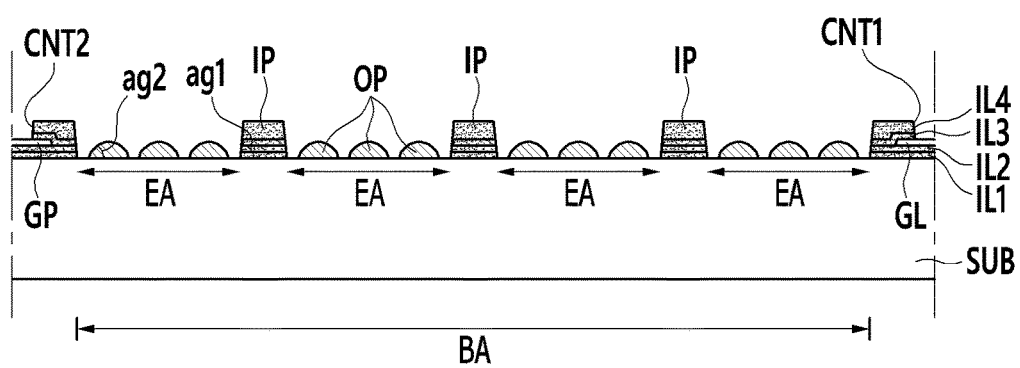

Referring to FIG. 8 and FIG. 9, a pattern forming layer (OPL) including an organic material is generated on the step portions (IP) as shown in FIG. 8, and the pattern forming layer (OPL) is etched to form a plurality of pattern portions (OP), as shown in FIG. 9. The pattern forming layer (OPL) may include a polyimide. The pattern portions (OP) may be formed to be in a line form extending in parallel with the direction in which the step portions (IP) extend. The pattern portions (OP) may be provided at regular intervals and may be formed to be lower than the step portions (IP). The pattern portions (OP) may be formed by using a pattern forming layer (OPL) including a photosensitive material, providing a mask thereon, exposing the same, and etching the same. However, a method for forming the pattern portions (OP) is not limited thereto. A surface of the pattern portion OP may be formed to have a curvature. A height of the pattern portions (OP) may be formed to be equal to or greater than about 700 nm and equal to or less than 800 nm, and an interval between the pattern portions (OP) may be formed to be about 2 μm. A second angle ag2 that is an acute angle of sides of each of the pattern portions OP from the substrate (SUB) may be formed to be less than the first angle ag1 that is an acute angle of the sides of each of the step portions (IP) from the substrate (SUB). The second angle ag2 may be formed to be equal to or greater than about 30° and equal to or less than about 45°, and in detail, it may be about 36° or about 40°.

Figure 10:
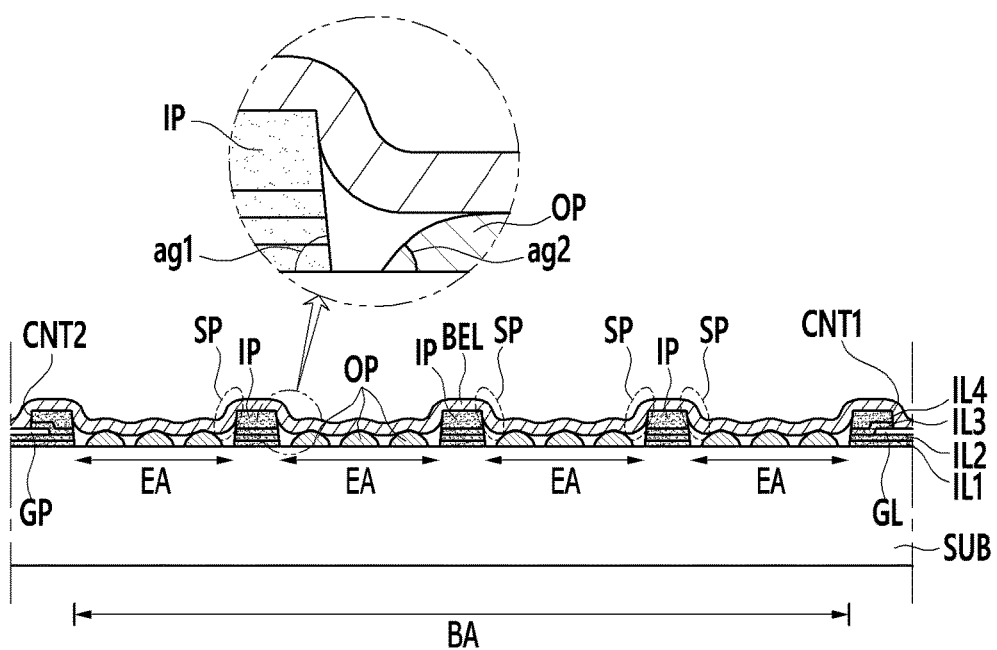

Referring to FIG. 10, a bridge electrode forming layer (BEL) is stacked on the step portions (IP) and the pattern portions (OP). The bridge electrode forming layer (BEL) may be stacked when the source electrode and the drain electrode are stacked in the display area. The bridge electrode forming layer (BEL) may be stacked with a material including aluminum (Al) and/or titanium (Ti). The bridge electrode forming layer (BEL) may be stacked to cover a gate line (GL) portion exposed through a first connection hole CNT1 and a gate pad (GP)) portion exposed through a second connection hole CNT2. A height difference of the bridge electrode forming layer (BEL) stacked on the step portions (IP) from the substrate (SUB) is reduced by the pattern portions OP formed among the step portions (IP) so the bridge electrodes (BE) is formed to have a gentle slope on a side portion (SP) of the step portion (IP).

Figure 11:
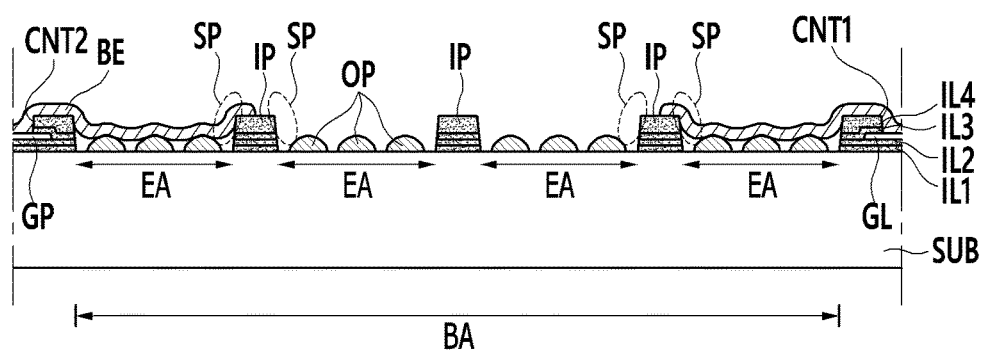

Referring to FIG. 4 and FIG. 11, the bridge electrode forming layer (BEL) is etched to form the bridge electrodes (BE). The bridge electrodes (BE) separated from each other at regular intervals and extending to cross the step portions (IP) may be formed by etching the bridge electrode forming layer (BEL) at regular intervals in the direction in which the step portions (IP) extend. In this instance, the bridge electrode forming layer (BEL) is formed to have a gentle slope on the side portion (SP) of the step portion (IP) so when the bridge electrode forming layer (BEL) is etched at regular intervals, a residual layer may not remain but is instead removed. Therefore, a short circuit among the bridge electrodes (BE) caused by the residual layer may be prevented.

Accordingly, the display device may be manufactured by further stacking an organic light emitting element (OLED) and an encapsulation portion for covering the organic light emitting element (OLED) in the display area and sealing the display area.

A display device according to an exemplary embodiment will now be described with reference to FIG. 12 and FIG. 13. The same parts as the above-described exemplary embodiment will not be described.

Figure 12:
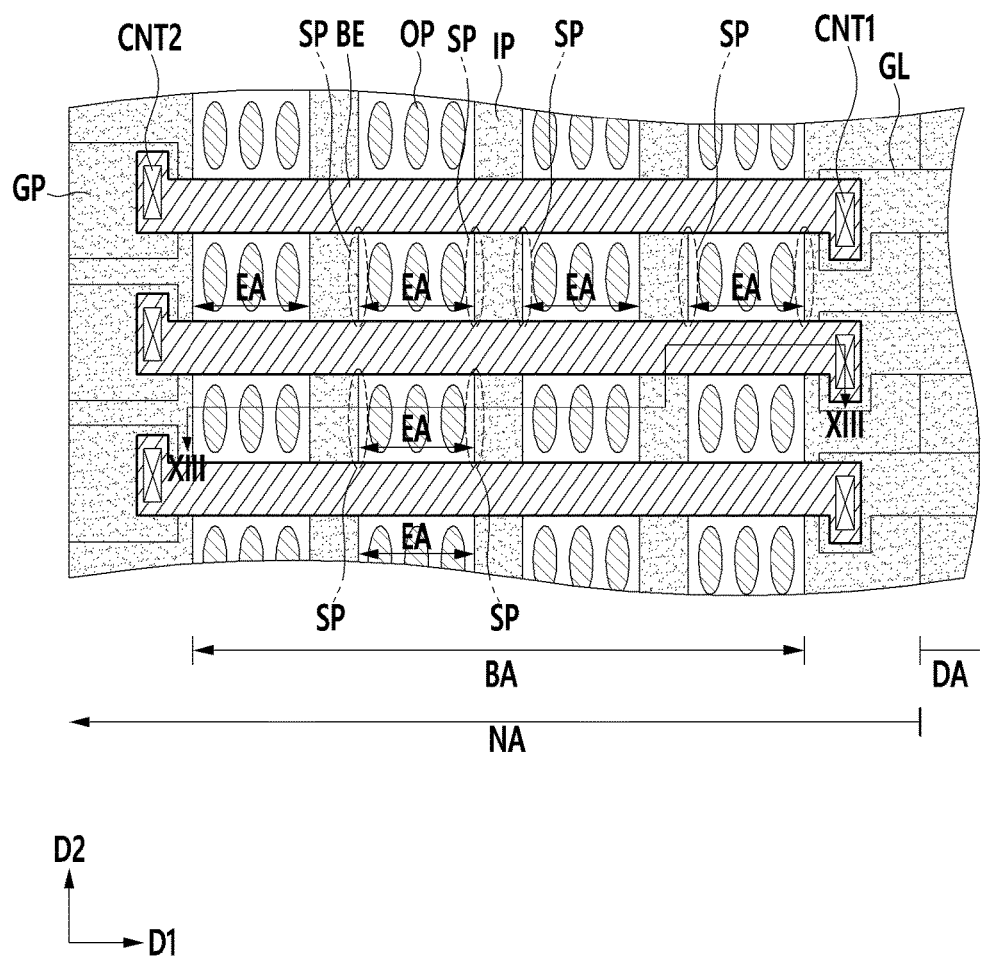
FIG. 12 shows an enlarged surface of a substrate of a display device according to an exemplary embodiment of the present invention.
Figure 13:
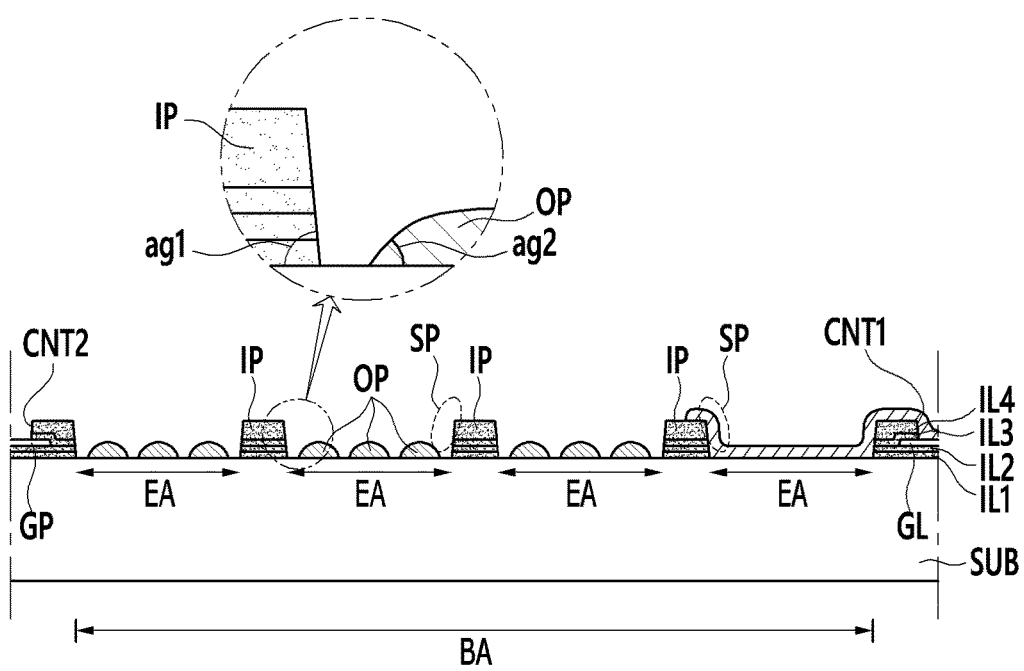
FIG. 13 shows a cross-sectional view of a display device taken along line XIII-XIII in FIG. 12.

FIG. 12 shows an enlarged surface of a substrate of a display device according to an exemplary embodiment of the present invention, and FIG. 13 shows a cross-sectional view of a display device of FIG. 12 with respect to a line XIII-XIII.

A plurality of step portions (IP) extending in the second direction D2 that is parallel in a line form with the bending direction of the substrate (SUB), and a plurality of bridge electrodes (BE) extending in the first direction D1 crossing the step portions (IP) are provided in the bending area (BA) of the non-display area (NA). The step portions (IP) cross the bridge electrodes (BE) in a lattice form, and a plurality of pattern portions (OP) are provided in the lattice form. The pattern portions (OP) may have an island shape. The pattern portions (OP) may be provided on a portion where the step portions (IP) and the bridge electrodes (BE) are not provided. FIG. 12 shows that the pattern portions (OP) have an oval shape, but the shape of the pattern portions (OP) is not limited thereto and, for example, they may each have a polygonal shape. The number of pattern portions (OP) may vary, and at least one thereof may be provided between the lattices. The surface of the pattern portion OP may be formed to have a curvature.

The bridge electrode (BE) may be removed from the portion where the bridge electrodes (BE) are separated from each other. The bridge electrodes (BE) may be formed by etching a bridge electrode forming layer stacked on the step portions (IP), and in this instance, the height difference of the bridge electrode forming layer from the substrate (SUB) is reduced on the portion where the bridge electrode forming layer is etched because the pattern portions (OP) formed between the step portions (IP) and the bridge electrode forming layer is formed with a gentle slope on the side portion (SP) of the step portion (IP), so the residual layer may not remain but may be removed when the bridge electrode forming layer is etched.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a substrate comprising:
    a display area configured to display an image; and
    a non-display area provided on a side of the display area and comprising a bending area configured to be bent with respect to an axis parallel to a first direction;
    a plurality of step portions disposed in the bending area and extending in the first direction;
    a plurality of bridge electrodes extending in a second direction crossing the first direction in the bending area; and
    a plurality of pattern portions disposed in the bending area,
    wherein:
    the step portions and the pattern portions are non-overlapping;
    the step portions are spaced apart from each other, and the pattern portions are disposed between adjacent step portions; and
    the pattern portions are lower than the step portions, and an acute angle of sides of each of the pattern portions from the substrate is smaller than an acute angle of sides of each of the step portions from the substrate.

2. The display device of claim 1, wherein the pattern portions comprise an organic material, and the step portions comprise an inorganic material.

3. The display device of claim 2, wherein the pattern portions extend in a same direction as the step portions.

4. The display device of claim 3, wherein the step portions each have a line shape in a plan view and are spaced apart from each other at regular intervals.

5. The display device of claim 4, wherein the pattern portions each have a line shape or an oval shape in a plan view and are spaced apart from each other at regular intervals.

6. The display device of claim 3, further comprising:
    a plurality of signal lines extending to the non-display area from the display area; and
    a driver disposed in the non-display area,
    wherein the bridge electrodes connect the signal lines with the driver.

7. The display device of claim 6, wherein the bridge electrodes are disposed on the step portions.

8. The display device of claim 7, wherein the bridge electrodes comprise at least one of aluminum and titanium.

9. A method for manufacturing a display device, comprising:
    providing a substrate comprising a display area for displaying an image and a non-display area provided on a side of the display area, the non-display area comprising a bending area configured to be bent with respect to an axis parallel to a first direction;
    forming a plurality of signal lines and a plurality of pads on the substrate;
    forming an at least one insulating layer on the signal lines and the pads;
    forming a plurality of step portions in the bending area by etching the at least one insulating layer;
    forming a pattern forming layer on the step portions and etching the pattern forming layer to form a plurality of patterns;
    forming a bridge electrode forming layer on the step portions and the pattern portions; and
    forming a plurality of bridge electrodes by etching the bridge electrode forming layer,
    wherein:
    the step portions are spaced apart from each other and extend in the first direction, and the pattern portions are formed between adjacent step portions; and
    the pattern portions are lower than the step portions, and an acute angle of sides of each of the pattern portions from the substrate is smaller than an acute angle of sides of each of the step portions from the substrate.

10. The method of claim 9, wherein the pattern forming layer is formed with a material comprising an organic material, and the at least one insulating layer is formed with a material comprising an inorganic material.

11. The method of claim 10, wherein the pattern portions extend in a same direction as the step portions.

12. The method of claim 11, wherein the step portions each have a line shape in a plan view and are spaced apart from each other at regular intervals.

13. The method of claim 12, wherein the pattern portions each have a line shape or an oval shape in a plan view and are spaced apart from each other at regular intervals.

14. The method of claim 11, wherein the bridge electrodes connect the signal lines with the pads.

15. The method of claim 14, wherein the bridge electrode forming layer is formed with a material comprising at least one of aluminum and titanium.

16. The method of claim 15, wherein the signal lines cross the bridge electrodes.

* * * * *